(12) United States Patent
Ohno

(10) Patent No.: US 6,507,057 B1
(45) Date of Patent: Jan. 14, 2003

(54) CROSS UNDER METAL WIRING STRUCTURE FOR SELF-SCANNING LIGHT-EMITTING DEVICE

(75) Inventor: Seiji Ohno, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 0 days.

(21) Appl. No.: 09/856,083
(22) PCT Filed: Sep. 19, 2000
(86) PCT No.: PCT/JP00/06373
§ 371 (c)(1), (2), (4) Date: May 17, 2001
(87) PCT Pub. No.: WO01/21412
PCT Pub. Date: Mar. 29, 2001

(30) Foreign Application Priority Data

Sep. 21, 1999 (JP) .......................................... 11-266867

(51) Int. Cl.⁷ .............................................. H01L 29/80
(52) U.S. Cl. ........................ 257/257; 257/91; 257/743; 257/745
(58) Field of Search ........................... 257/91, 99, 745, 257/93, 743, 257

(56) References Cited

U.S. PATENT DOCUMENTS 6,180,960 B1 * 1/2001 Kusuda et al. ................ 257/91

FOREIGN PATENT DOCUMENTS

| JP | 2-208067 | 8/1990 | |
| JP | 5-95085 | 4/1993 | |
| JP | 9-99583 | 4/1997 | |
| JP | 409283801 | * 10/2001 | .......... H01L/33/00 |

OTHER PUBLICATIONS

PCT International Search Report, Dec. 12, 2000.

* cited by examiner

Primary Examiner—Richard Elms
Assistant Examiner—Brad Smith
(74) Attorney, Agent, or Firm—RatnerPrestia (57) ABSTRACT

A cross under metal wiring structure which may prevent "latch-up" from causing at a pnpn-structure is provided. The cross under metal wiring structure comprises a lower wiring provided on a topmost layer of the pnpn-structure isolated in an island by a groove, and an upper wiring connected to the lower wiring through a first contact hole opened in an insulating film covered the isolated pnpn-structure and to a layer just below the topmost layer through a second contact hole opened in the insulating film.

5 Claims, 5 Drawing Sheets

CROSS UNDER METAL WIRING STRUCTURE FOR SELF-SCANNING LIGHT-EMITTING DEVICE

TECHNICAL FIELD

The present invention relates to a self-scanning light-emitting device, in particular to a cross under metal wiring structure for a self-scanning light-emitting device.

BACKGROUND ART

A light-emitting device in which a plurality of light-emitting elements are arrayed on the same substrate is utilized as a light source of a printer, in combination with a driver circuit. The inventor of the present invention has interest in a three-terminal light-emitting thyristor having an pnpn-structure as an element of the light-emitting device, and has already filed several patent applications (see Japanese Patent Publication Nos. 1-238962, 2-14584, 2-92650, and 2-92651.) These publications have disclosed that a self-scanning function for light-emitting elements may be implemented, and further have disclosed that such self-scanning light-emitting device has a simple and compact structure for a light source of a printer, and has smaller arraying pitch of thyristors.

The inventor has further provided a self-scanning light-emitting device having such structure that an array of light-emitting thyristors having transfer function is separated from an array of light-emitting thyristors having writable function (see Japanese Patent Publication No. 2-263668.)

Figure 1:
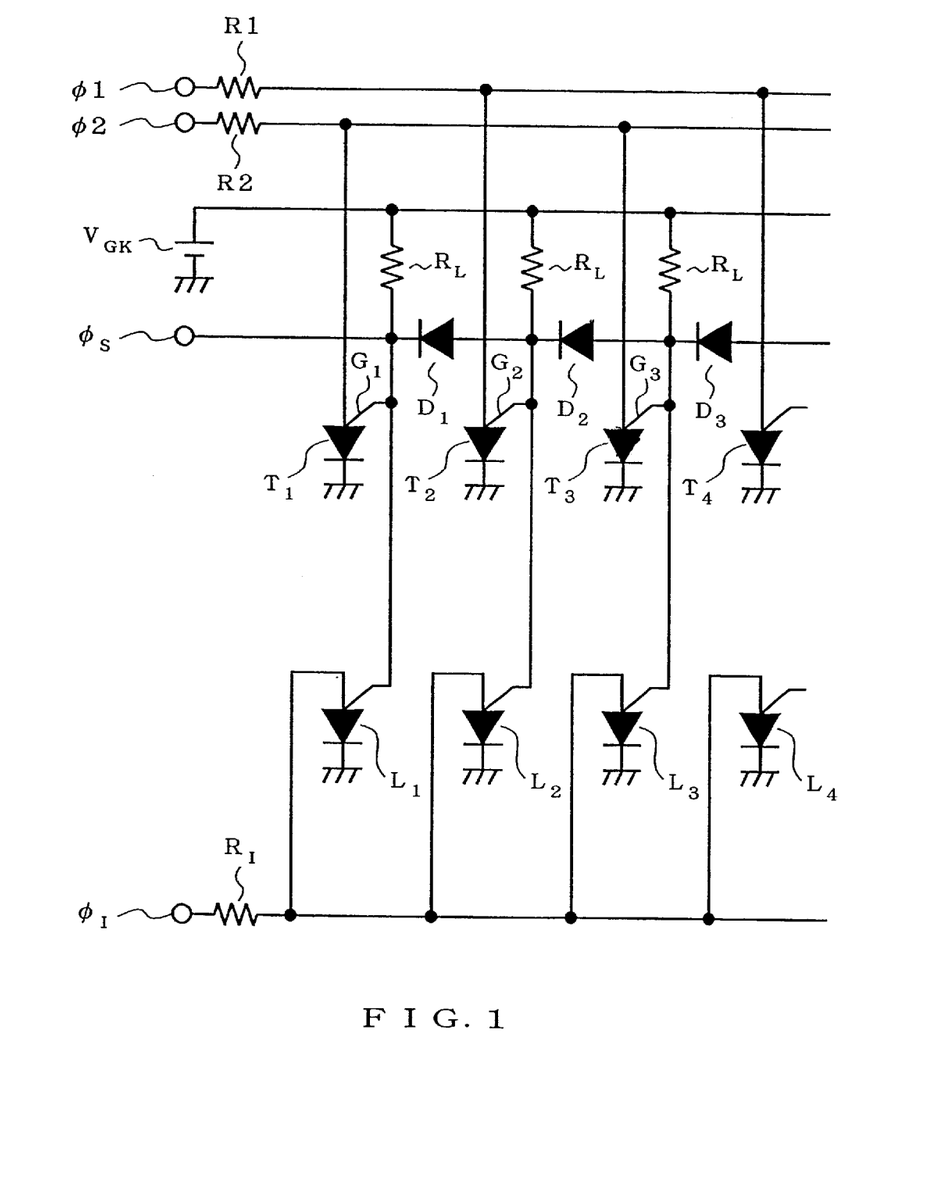
FIG. 1 is an equivalent circuit diagram of a fundamental structure of this self-scanning light-emitting device.

Referring to FIG. 1, there is shown an equivalent circuit diagram of a fundamental structure of this self-scanning light-emitting device. According to this structure, the device comprises an array of transfer elements $T_1, T_2, T_3, \ldots$ and an array of writable light-emitting elements $L_1, L_2, L_3, \ldots$, these elements consisting of three-terminal light-emitting thyristors. The structure of the portion of an array of transfer elements includes diode $D_1, D_2, D_3, \ldots$ as means for electrically connecting the gate electrodes of the neighboring transfer elements to each other. $V_{GK}$ is a power supply (normally 5 volts), and is connected to all of the gate electrodes $G_1, G_2, G_3, \ldots$ of the transfer elements via a load resistor $R_L$, respectively. Respective gate electrodes $G_1, G_2, G_3, \ldots$ are correspondingly connected to the gate electrodes of the writable light-emitting elements $L_1, L_2, L_3, \ldots$ A start pulse $\phi_s$ is applied to the gate electrode of the transfer element $T_1$, transfer clock pulses $\phi 1$ and $\phi 2$ are alternately applied to all of the anode electrodes of the transfer elements, and a write signal $\phi_I$ is applied to all of the anode electrodes of the light-emitting elements.

Figure 4:
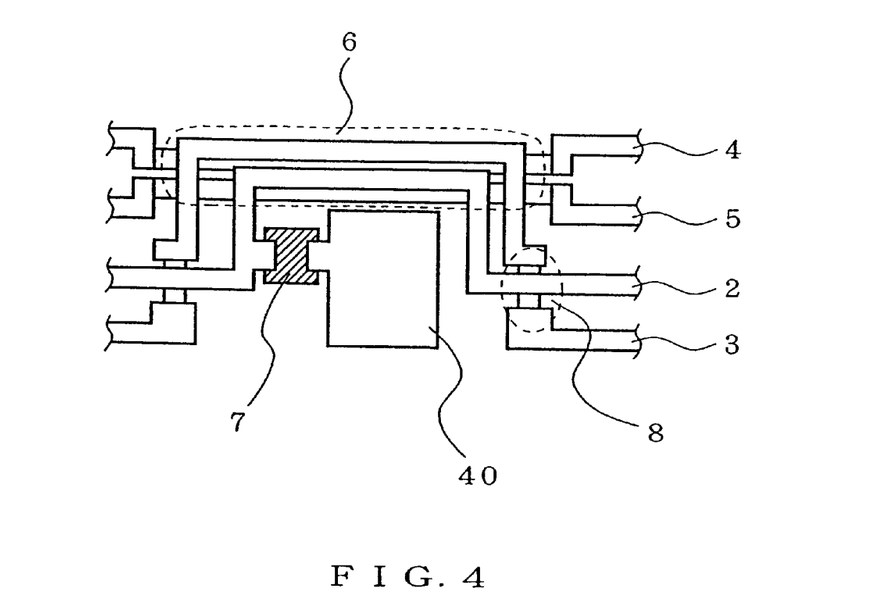
FIG. 4 shows wirings formed in a two-layer structure.

In FIG. 4, R1, R2 and $R_I$ designate current limiting resistors, respectively.

The operation of this self-scanning light-emitting device will now be described briefly. Assume that as the transfer clock $\phi 1$ is driven to a high level, the transfer element $T_2$ is turned on. At this time, the voltage of the gate electrode $G_2$ is dropped to a level near zero volts from 5 volts. The effect of this voltage drop is transferred to the gate electrode $G_3$ via the diode $D_2$ to cause the voltage of the gate electrode $G_3$ to set about 1 volt which is a forward rise voltage (equal to the diffusion potential) of the diode $D_2$. On the other hand, the diode $D_1$ is reverse-biased so that the potential is not conducted to the gate $G_1$, then the potential of the gate electrode $G_1$, remaining at 5 volts. The turn on voltage of the light-emitting thyristor is approximated to a gate electrode potential+a diffusion potential of pn-junction (about 1 volt.) Therefore, if a high level of a next transfer clock pulse $\phi 2$ is set to the voltage larger than about 2 volts (which is required to turn-on the transfer element $T_3$) and smaller than about 4 volts (which is required to turn on the transfer element $T_5$), then only the transfer element $T_3$ is turned on and other transfer elements remain off-state, respectively. As a result of which, on-state is transferred from $T_2$ to $T_3$. In this manner, on-state of transfer elements are sequentially transferred by means of two-phase clock pulses.

The start pulse $\phi_s$ works for starting the transfer operation described above. When the start pulse $\phi_s$ is driven to a low level (about 0 volt) and the transfer clock pulse $\phi 2$ is driven to a high level (about 2–4 volts) at the same time, the transfer element $T_1$ is turned on. Just after that, the start pulse $\phi_s$ is returned to a high level. Assuming that the transfer element $T_2$ is in the on-state, the voltage of the gate electrode $G_2$ is lowered to almost zero volt. Consequently, if the voltage of the write signal $\phi_I$ is higher than the diffusion potential (about 1 volt) of the pn-junction, the light-emitting element $L_2$ may be turned into an on-state (a light-emitting state).

On the other hand, the voltage of the gate electrode $G_1$ is about 5 volts, and the voltage of the gate electrode $G_3$ is about 1 volt. Consequently, the write voltage of the light-emitting element $L_1$ is about 6 volts, and the write voltage of the light-emitting element $L_3$ is about 2 volts. It is appreciated from this that the voltage of the write signal $\phi_I$ which can write into only the light-emitting element $L_2$ is in a range of about 1–2 volts. When the light-emitting element $L_2$ is turned on, that is, in the light-emitting state, the amount of light thereof is determined by the amount of current of the write signal $\phi_I$. Accordingly, the light-emitting elements may emit the light at any desired amount of light. In order to transfer on-state to the next element, it is necessary to first turn off the element in on-state by temporarily dropping the voltage of the write signal $\phi_I$ down to zero volts.

The self-scanning light-emitting device described above may be fabricated by arraying a plurality of chips each thereof being 600 dpi (dot per inch)/128 light-emitting points and having 5.4 mm length. These chips are fabricated on a wafer and obtained by dicing them.

Figure 2:
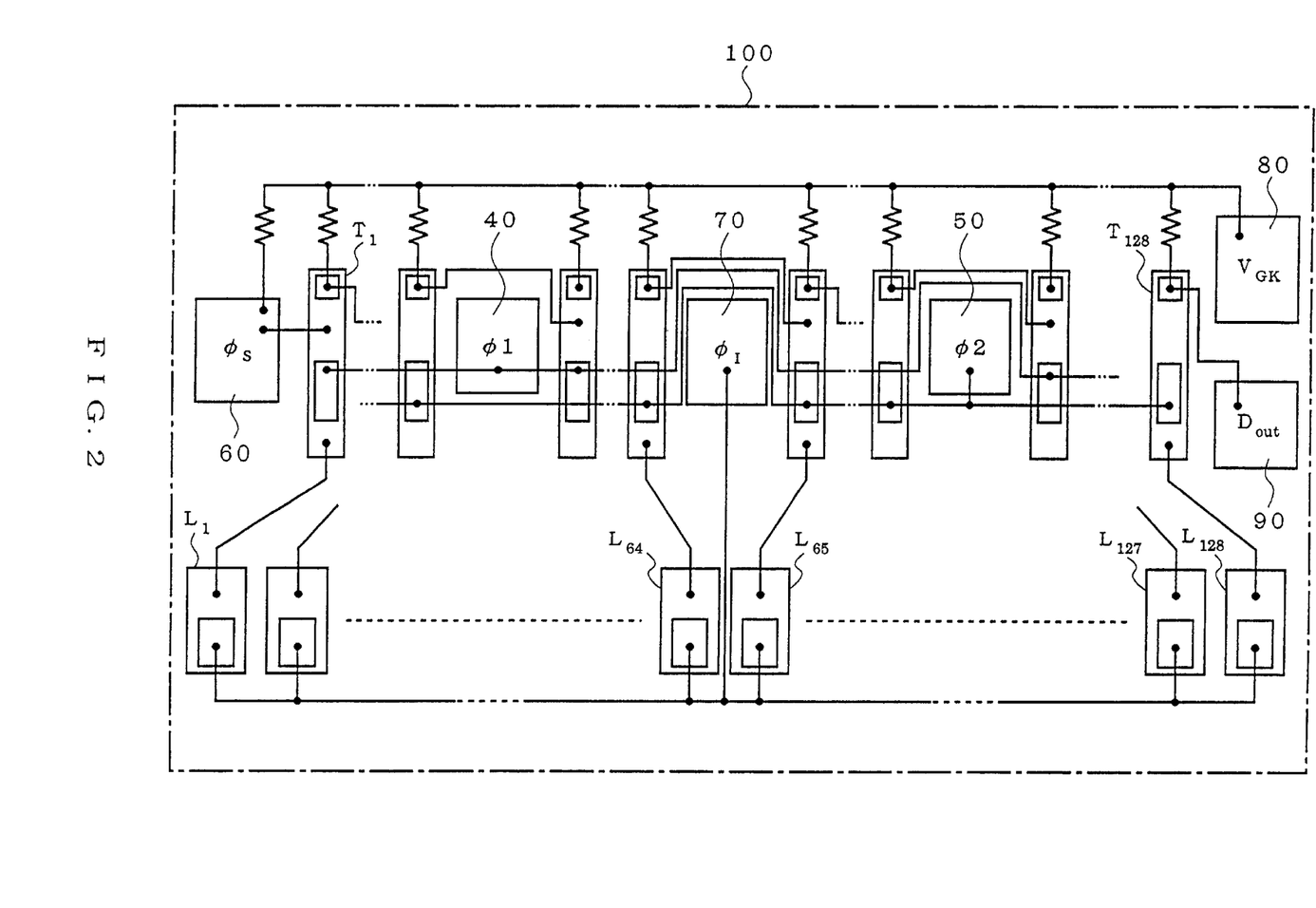
FIG. 2 shows an element arrangement in a chip for the self-scanning light-emitting device.

An example of an element arrangement in a chip for the self-scanning light-emitting device is schematically shown in FIG. 2. In the figure, $L_1$–$L_{128}$ designate light-emitting elements, $T_1$–$T_{128}$ transfer elements, 40 and 50 bonding pads for clock pulses $\phi 1$ and $\phi 2$, 60 a bonding pad for a start pulse $\phi_s$, 70 a bonding pad for a write signal $\phi_I$, 80 a bonding pad for a power supply $V_{GK}$, and 90 a bonding pad for an output $D_{out}$, respectively. Reference numeral 100 denotes the outer line of the chip.

In the element arrangement shown in FIG. 2, a number of metal wirings are required for connecting the light-emitting elements and transfer element in an array fashion. In particular, four metal wirings for $\phi 1$, $\phi 2$, $V_{GK}$, and diode connection make a detour around the bonding pads 40, 50 and 70 provided at a center of the chip.

Figure 3:
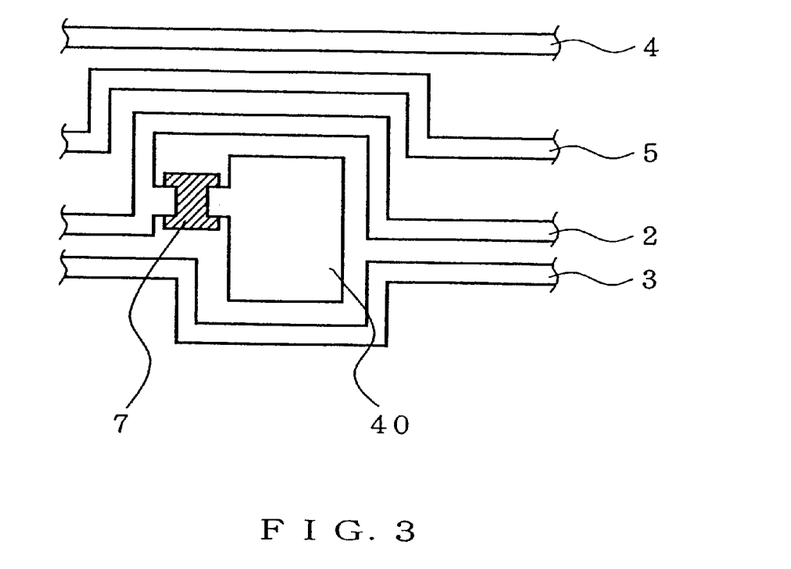
FIG. 3 shows metal wirings around the bonding pad for φ1.

FIG. 3 shows the metal wirings around the bonding pad 40 for $\phi 1$. In the figure, an example is shown wherein a current limiting resistor R1 (see FIG. 1) is built in the chip. Reference numerals 2, 3, 4 and 5 designate $\phi 1$ wiring, $\phi 2$ wiring, $V_{GK}$ wiring, and diode connection wiring, respectively. Apparent from the figure, these wirings are formed so as to make a detour around the bonding pad 40.

Such detour of wiring causes the problem in that the size of a chip is enlarged. In order to resolve this problem, there is an approach such that the wirings are formed in a two-layer structure as shown in FIG. 4. That is, the $V_{GK}$ wiring 4 and diode connection wiring 5 are formed under the φ1 wiring 2 and φ2 wiring 3. In FIG. 4, the portion where the wiring 4 and 5 are crossed with the wirings 2 and 3 is shown as a cross under wiring portion 6 circled by a dotted line 6. Also, at the portion where the φ1 wiring 2 and φ2 wiring are crossed each other, the φ2 wiring 3 is formed under the φ1 wiring 2. In FIG. 4, the portion where the φ1 wiring 2 and φ2 wiring 3 are crossed each other is denoted as a cross under wiring portion 8 circled by a dotted line.

Figure 5:
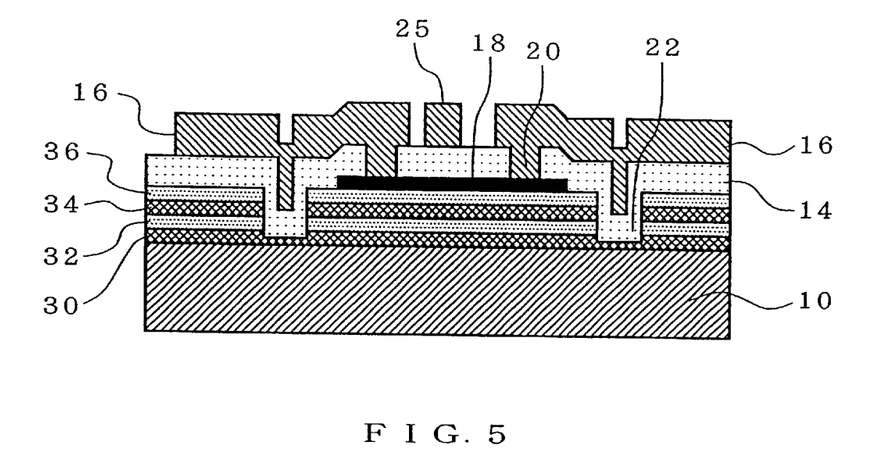
FIG. 5 is a cross sectional view of the cross under portion in FIG. 4.

Referring to FIG. 5, there is shown a cross sectional view of the cross under portion 8 in FIG. 4. A pnpn-structure constituting a three-terminal light-emitting thyristor is constructed by stacking a p-type semiconductor layer 30, an n-type semiconductor layer 32, a p-type semiconductor layer 34, and an n-type semiconductor layer 36 in this order on a p-type semiconductor substrate 10. It should be noted that the pnpn structure may be used in which an n-type semiconductor layer, a p-type semiconductor layer, an n-type semiconductor layer, and a p-type semiconductor layer are stacked in this order on an n-type semiconductor substrate.

A lower metal wiring 18 is provided on the portion of the pnpn-structure isolated in an island by a groove 22. The lower metal wiring 18 is electrically isolated from the substrate 10 by the pnpn-structure.

The lower metal wiring 18 is connected to an upper metal wiring 16 through contact holes 20 opened in a insulating film 14 deposited on the above described structure, resulting in a cross under wiring. The upper wiring 16 and lower wiring 18 constitute together one wiring, i.e. the φ2 wiring 3 (see FIG. 4). One wiring 25 crossing to the φ2 wiring 3 in FIG. 5 corresponds to the φ1 wiring 2 in FIG. 4. In this manner, the lower wiring 18 is electrically insulated from the upper wiring 25 by the insulating film 14, so that the crossing of both wirings is possible.

As the self-scanning light-emitting device is based on a thyristor of pnpn-structure, if a voltage is applied to the pnpn-structure isolated in an island by a groove from the metal wiring provided on the pnpn-structure, "latch-up phenomenon" may be caused. When "latch-up phenomenon" is caused at the pnpn-structure, the thyristor may not only operate normally, but also has a risk in that a large current flows through the thyristor resulting in breakdown.

DISCLOSURE OF THE INVENTION

An object of the present invention is to provide a cross under metal wiring structure which may prevent "latch-up" from causing at a pnpn-structure.

The present invention is a cross under metal wiring structure for a self-scanning light-emitting device including a self-scanning transfer element array having such a structure that a plurality of three-terminal transfer elements of pnpn-structure each having a control electrode are arranged, the control electrodes of the transfer elements neighbored to each other are connected via first electrical means, a power supply line is connected to the control electrodes via second electrical means, and clock lines are connected to one of two terminals except the control electrode of each of the transfer elements; and a light-emitting element array having such a structure that a plurality of three-terminal light-emitting elements of pnpn-structure are arranged, the control electrodes of the light-emitting element array are connected to the control electrodes of the transfer element array, and a line for applying a write signal connected to one of two terminals except the control electrode of each of the light-emitting elements is provided. The cross under metal wiring structure is provided on the pnpn-structure isolated in an island by a groove.

According to the present invention, the following approaches can be taken to prevent "latch-up" due to the applied voltage from causing at a light-emitting thyristor of pnpn-structure isolated in an island by a groove when a cross under metal wiring is formed on the isolated pnpn-structure.

(1) It is intended that a potential difference is not caused between the upper two layers of the pnpn-structure.

(2) The material of a lower wiring is selected so that the lower wiring is made ohmic contact with the topmost layer of the pnpn-structure.

(3) An insulating-type semiconductor layer is provided between the topmost layer of the pnpn-structure and the lower wiring formed on the topmost layer.

(4) The topmost layer of the pnpn-structure is removed to form a pnp-structure or npn-structure on which a lower wiring is formed.

According to a first aspect of the present invention, the cross under metal wiring structure comprises a lower wiring provided on a topmost layer of the pnpn-structure isolated in an island by a groove, and an upper wiring connected to the lower wiring through a first contact hole opened in an insulating film covered the isolated pnpn-structure and to a layer just below the topmost layer through a second contact hole opened in the insulating film.

According to a second aspect of the present invention, the cross under metal wiring structure comprises a lower wiring provided on a topmost layer of the, pnpn-structure isolated in an island by a groove, and an upper wiring connected to the lower wiring through a contact hole opened in an insulating film covered the isolated pnpn-structure, wherein the lower wiring is made of material which makes non-ohmic contact with the topmost layer.

According to a third aspect of the present invention, the cross under metal wiring structure comprises an insulating layer provided on a topmost layer of the pnpn-structure isolated in an island by a groove, a lower wiring provided on the insulating layer, and an upper wiring connected to the lower wiring through a contact hole opened in an insulating film covered the isolated pnpn-structure.

According to a fourth aspect of the present invention, the pnpn-structure is changed into a pnp-structure or npn-structure by removing a topmost layer of the pnpn-structure. The cross under metal wiring structure comprises a lower wiring provided on a topmost layer of the pnp-structure or npn-structure isolated in an island by a groove, and an upper wiring connected to the lower wiring through a contact hole opened in an insulating film covered the isolated pnp-structure or npn-structure.

BEST MODE FOR CARRYING OUT THE INVENTION

Embodiments of the present invention will now be described in detail with reference to the drawings.

A First Embodiment

Figure 6:
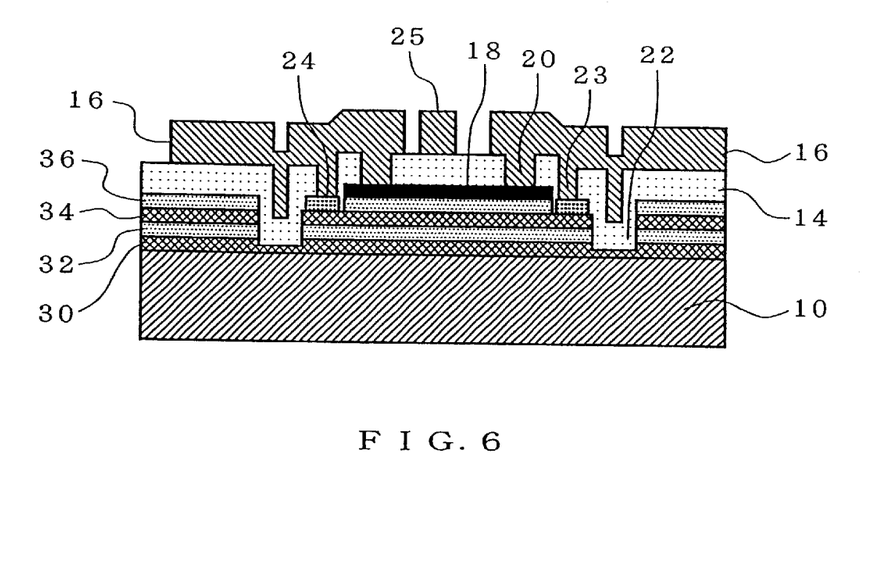
FIG. 6 is a cross sectional view of a cross under metal wiring structure according to a first embodiment of the present invention.

Referring to FIG. 6, there is shown a cross sectional view of a cross under metal wiring structure of a first embodiment. It should be noted that like components in FIG. 6 are indicated by like reference numerals in FIG. 5.

A p-type GaAs is used for a semi-conductor substrate 10, a p-type GaAs for p-type semiconductor layers 30 and 34, an n-type GaAs for n-type semiconductor layers 32 and 36, and $SiO_2$ for an insulating film 14. Al is used for upper wirings 16 and 25, and AuZn for a lower wiring 18.

According to the first embodiment, in order to prevent "latch-up" in the pnpn-structure thyristor, it is required that the potential difference is not caused between the upper semiconductor layers 34 and 36 of pnpn-structure, i.e. the p-type semiconductor layer 34 and n-type semiconductor layer 36 are at the same potential. For this purpose, electrodes 24 are provided on the p-type semiconductor layer 34, which are made ohmic contact with the layer 34, and are connected to the upper wiring 16 through contact holes 23 opened in the insulating film 14, as a result the p-type semiconductor layer 34 and n-type semiconductor layer 36 are connected through the upper wiring 16. Therefore, the semiconductor layers 34 and 36 are always at the same potential, thereby the pnpn-structure thyristor consisting of the semiconductor layers 30, 32, 34 and 36 never cause "latch-up phenomenon".

A Second Embodiment

Another method for preventing "latch-up" of a pnpn-structure structure thyristor is to cause a latching current not to flow through the pnpn-structure. For this purpose, in the conventional structure shown in FIG. 5, the material of the lower wiring 18 is selected so as to make non-ohmic contact (for example, schottky contact) with the topmost n-type semiconductor layer 36 made of n-type GaAs.

Concretely, AuZn is used for the material of the lower wiring 18. In this case, the rectifying characteristic of metal-semiconductor (n-type) is a forward direction characteristic when the metal side is at a positive potential. As this forward direction is opposite to the forward direction of the pnpn-structure on the p-type substrate 10, the latching current may not be flowed through the pnpn-structure.

It is desirable for the lower wiring 18 to use the same material as that of electrodes for the p-type semiconductor layer 34, because the fabricating process can be simplified by forming the lower wiring 18 and the electrodes for the p-type semiconductor layer at the same time.

A Third Embodiment

According to this embodiment, in the conventional metal wiring structure shown in FIG. 5, an insulating-type semiconductor layer (not shown) is deposited on the pnpn-structure, and the lower wiring 18 is provided thereon. Non-doped GaAs may be used as material for the insulating-type semiconductor layer.

In accordance with this structure, "latch-up phenomenon" is not caused, because a voltage is not applied to the pnpn-structure due to the presence of the insulating-type semiconductor layer on the pnpn-structure.

A Fourth Embodiment

In this embodiment, a lower wiring is isolated from a substrate by a pnp-structure which corresponds to such structure that the uppermost n-type semiconductor layer is removed from the pnpn-structure.

Figure 7:
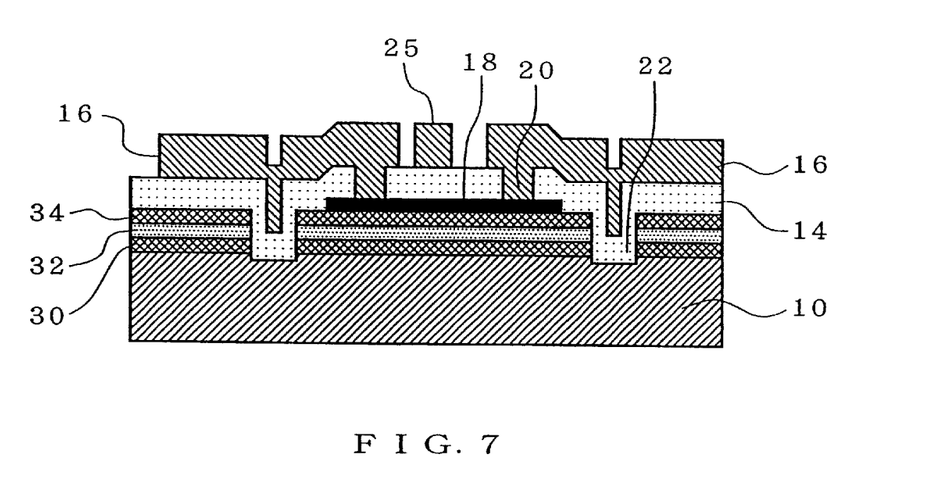
FIG. 7 is a cross sectional view of a cross under metal wiring structure according to a second embodiment of the present invention.

FIG. 7 shows a cross sectional view of a cross under metal wiring structure of this embodiment. The lower wiring 18 is electrically isolated from the p-type GaAs substrate 10 by the pnp-structure (30, 32, 34) that corresponds to the structure in which the n-type GaAs layer 36 is removed from the pnpn-structure in FIG. 5. Adopting such pnp-structure, the problem of "latch-up" inherent in the pnpn-structure thyristor is not caused.

It should be noted that an npn-structure may also be adopted in this embodiment.

While the present invention has explained with reference to four embodiments, it is apparent for those who skilled in the art that the present invention may be applicable to not only a self-scanning light-emitting device but also a semiconductor device base on a pnpn-structure.

INDUSTRIAL APPLICABILITY

According to the present invention, it is possible to prevent "latch-up" in the pnpn-structure when a cross under metal wiring is formed thereon.

What is claimed is:

1. A cross under metal wiring structure for a self-scanning light-emitting device including a self-scanning transfer element array having such a structure that a plurality of three-terminal transfer elements of pnpn-structure each having a control electrode are arranged, the control electrodes of the transfer elements neighbored to each other are connected via first electrical means, a power supply line is connected to the control electrodes via second electrical means, and clock lines are connected to one of two terminals except the control electrodes of each of the transfer elements; and a light-emitting element array having such a structure that a plurality of three-terminal light-emitting elements of pnpn-structure are arranged, the control electrodes of the light-emitting element array are connected to the control electrodes of the transfer element array, and a line for applying a write signal connected to one of two terminals except the control electrode of each of the light-emitting elements is provided; characterized in that:

the cross under metal wiring structure comprises,
a lower wiring provided on a topmost layer of the pnpn-structure isolated in an island by a groove, and
an upper wiring connected to the lower wiring through a first contact hole opened in an insulating film covering the isolated pnpn-structure and to a layer just below the topmost layer through a second contact hole opened in the insulating film.

2. A cross under metal wiring structure for a self-scanning light-emitting device including a self-scanning transfer element array having such a structure that a plurality of three-terminal transfer elements of pnpn-structure each having a control electrode are arranged, the control electrodes of the transfer elements neighbored to each other are connected via first electrical means, a power supply line is connected to the control electrodes via second electrical means, and clock lines are connected to one of two terminals except the control electrodes of each of the transfer elements; and a light-emitting element array having such a structure that a plurality of three-terminal light-emitting elements of pnpn-structure are arranged, the control electrodes of the light-emitting element array are connected to the control electrodes of the transfer element array, and a line for applying a write signal connected to one of two terminals except the control electrode of each of the light-emitting elements is provided, characterized in that:

the cross under meal wiring structure comprises:
a lower wiring provided on a topmost layer of the pnpn-structure isolated in an island by a groove, and
an upper wiring connected to the lower wiring through a contact hole opened in a insulating film covering the isolated pnpn-structure,
wherein the lower wiring is made of material which makes non-ohmic contact with the topmost layer.

3. The cross under metal wiring structure of claim 2, wherein the non-ohmic contact is a Schottky contact.

4. A cross under metal wiring structure for a self-scanning light-emitting device including a self-scanning transfer element array having such a structure that a plurality of three-terminal transfer elements of pnpn-structure each having a control electrode are arranged, the control electrodes of the transfer elements neighbored to each other are connected via first electrical means, a power supply line is connected to the control electrodes via second electrical means, and clock lines are connected to one of two terminals except the control electrodes of each of the transfer elements; and a light-emitting element array having such a structure that a plurality of three-terminal light-emitting elements of pnpn-structure are arranged, the control electrodes of the light-emitting element array are connected to the control electrodes of the transfer element array, and a line for applying a write signal connected to one of two terminals except the control electrode of each of the light-emitting elements is provided; characterized in that:

the cross under metal wiring structure comprises,
an insulating layer provided on a topmost layer of the pnpn-structure isolated in an island by a groove,
a lower wiring provided on the insulating layer, and
an upper wiring connected to the lower wiring through a contact hole opened in an insulating film covering the isolated pnpn-structure.

5. A cross under metal wiring structure for a self-scanning light-emitting device including a self-scanning transfer element array having such a structure that a plurality of three-terminal transfer elements of pnpn-structure each having a control electrode are arranged, the control electrodes of the transfer elements neighbored to each other are connected via first electrical means, a power supply line is connected to the control electrodes via second electrical means, and clock lines are connected to one of two terminals except the control electrodes of each of the transfer elements, and a light-emitting element array having such a structure that a plurality of three-terminal light-emitting elements of pnpn-structure are arranged, the control electrodes of the light-emitting element array are connected to the control electrodes of the transfer element array, and a line for applying a write signal connected to one of two terminals except the control electrode of each of the light-emitting elements is provided; characterized in that:

the pnpn-structure is changed into a pnp-structure or npn-structure by removing a topmost layer of the pnpn-structure, and
the cross under metal wiring structure comprises,
a lower wiring provided on a topmost layer of the pnp-structure or npn-structure isolated in an island by a groove, and
an upper wiring connected to the lower wiring through a contact hole opened in an insulating film covering the isolated pnp-structure or npn-structure.

* * * * *

UNITED STATES PATENT AND TRADEMARK OFFICE
CERTIFICATE OF CORRECTION

PATENT NO.     : 6,507,057 B1
DATED          : January 14, 2003
INVENTOR(S)    : Seiji Ohno It is certified that error appears in the above-identified patent and that said Letters Patent is hereby corrected as shown below:

Column 5,
Line 29, "structure structure thyristor is to cause a latching current not" should read -- structure thyristor is to cause a latching current not --.

Column 6,
Line 59, "provided. characterized in that:" should read -- provided; characterized in that: --.

Column 8,
Line 8, "control electrodes of each of the transfer elements. and a" should read -- control electrodes of each of the transfer elements; and a --.

Signed and Sealed this

First Day of July, 2003

JAMES E. ROGAN
*Director of the United States Patent and Trademark Office*